United States Patent
Dieter et al.

[11] Patent Number: 6,013,130
[45] Date of Patent: Jan. 11, 2000

[54] PROCESS AND DEVICE FOR THE PRODUCTION OF EPITAXIAL LAYERS

[75] Inventors: Ralph Dieter, Schwaikheim; Hans Opower, Krailling; Heinrich Weyer, Neunkirchen, all of Germany

[73] Assignee: Deutsche Forschungsanstalt Fuer Luft- und Raumfahrt e.V., Bonn, Germany

[21] Appl. No.: 08/620,876

[22] Filed: Mar. 22, 1996

[30] Foreign Application Priority Data

Mar. 22, 1995 [DE] Germany ............... 195 10 318

[51] Int. Cl.⁷ ............... C30B 25/02; B23K 26/12
[52] U.S. Cl. ............... 117/91; 117/92; 117/93; 427/561; 427/596
[58] Field of Search ............... 117/91, 92, 93; 427/561, 596

[56] References Cited

U.S. PATENT DOCUMENTS

| | | |
|---|---|---|
| 3,979,271 | 9/1976 | Noreika et al. ............... 204/192.25 |
| 4,788,082 | 11/1988 | Schmitt ............... 427/248.1 |
| 5,015,492 | 5/1991 | Venkatesan et al. ............... 427/8 |
| 5,158,931 | 10/1992 | Noda et al. ............... 505/474 |
| 5,164,040 | 11/1992 | Eres et al. ............... 427/600 |
| 5,254,832 | 10/1993 | Gartner et al. ............... 219/121.66 |
| 5,279,869 | 1/1994 | Doll et al. ............... 427/586 |
| 5,324,552 | 6/1994 | Opower et al. ............... 427/533 |
| 5,534,314 | 7/1996 | Wadley et al. ............... 427/585 |

FOREIGN PATENT DOCUMENTS

| | | |
|---|---|---|
| 63-38571 | 1/1988 | Japan . |
| 2-66165 | 3/1990 | Japan . |
| 2-230734 | 9/1990 | Japan . |
| 4-246167 | 9/1992 | Japan . |
| 5-70935 | 3/1993 | Japan . |
| 6-316761 | 11/1994 | Japan . |

OTHER PUBLICATIONS

Ghandi, Sorab K, "VSLI Fabrication Principles—Silicon and Gallium Arsenide", 2nd Ed. (New York: Wiley–Interscience): 514–517, 1994.

Meng et al., "Epitaxal Growth of Aluminum Nitride on Si(111) by Reactive Sputtering," *Applied Physics*, Letter 59(17), Oct. 1991, pp. 2097–2098.

Kamiyama, Masahide, Editor–in–Chief, *Thin Film Handbook*, Ohm Sha, Publisher, Oct. 1983.

*Primary Examiner*—Benjamin Utech
*Assistant Examiner*—Donald L. Champagne
*Attorney, Agent, or Firm*—Barry R. Lipsitz; Ralph F. Hoppin

[57] ABSTRACT

Layers of compound semiconductor 60 are grown epitaxially on a substrate 40. One or more components 24 are removed from a target 14 by a supply of energy 18, and reacted with gas surrounding the target. The gas stream conveys the components through a nozzle 34 to achieve a uniform layer on the substrate.

23 Claims, 4 Drawing Sheets

PROCESS AND DEVICE FOR THE PRODUCTION OF EPITAXIAL LAYERS

BACKGROUND OF THE INVENTION

The invention relates to a process for the production of layers of a chemical compound, in particular compound semiconductors, on a substrate by means of epitaxy.

According to the state of the art, epitaxial layers, in particular of compound semiconductors, are produced either with metal-organic vapor-phase epitaxy (MOVPE) or molecular beam epitaxy (MBE). With both processes, the compound semiconductor is produced on the hot substrate, on which the deposition of the epitaxial layer takes place. In the case of the metal-organic vapor phase epitaxy the compound semiconductor is formed from suitable vaporous precursor substances which are thermally degraded on the hot substrate, or, in the case of the molecular beam epitaxy, the compound semiconductor is formed from elementary components on the hot substrate.

Particularly with the epitaxial growth of nitride group III compound semiconductors, such as AlN, GaN, InN, difficulties occur, due to the strong bonding of nitrogen compounds, during the required degradation of these compounds on the hot substrate. This leads to unfavorable stoichiometric ratios in the semiconductor layer which has been deposited epitaxially, for example to nitrogen deficiencies, and therefore to poor layer qualities.

SUMMARY OF THE INVENTION

The object underlying the invention is therefore to make a process and a device available, with which epitaxial layers can be produced with the desired layer qualities.

This object is accomplished in accordance with the invention, in a process of the type described at the outset, in that at least one component of the chemical compound to be deposited epitaxially is removed from a target by a local, in particular punctual supply of energy, that a particle stream emanating from the target and comprising particles of the chemical compound to be deposited epitaxially is formed and that the particle stream enters a carrier gas stream conveying the particles of the chemical compound to be deposited epitaxially to the substrate.

The advantage of the inventive solution is to be seen, in particular, in the fact that the formation of the chemical compound takes place before the particles occur on the substrate and that the chemical compound which has already been formed is only then transported to the substrate by a carrier gas stream. This creates a considerable number of additional degrees of freedom which are of great advantage, on the one hand, for the formation of the chemical compound and, on the other hand, for the epitaxial deposition thereof. In particular, the inventive solution allows the possibility of defining different marginal conditions for the formation of the chemical compound than for the deposition of the chemical compound on the substrate. For example, the temperature of the substrate and the formation of the carrier gas stream on a surface of the substrate can be defined completely independently of the conditions for the formation of the chemical compound.

A particularly advantageous embodiment which uses the advantages of the invention in a consistent manner provides for the carrier gas stream to have essentially constant flow ratios with respect to time at a surface of the substrate.

Alternatively or in addition thereto, it is advantageously provided for the carrier gas stream to have essentially comparable flow ratios at every location on the entire surface of the substrate, and it is particularly expedient in this respect when the flow ratios are essentially equal overall.

Each of the measures specified above contributes to promoting a uniform epitaxial layer growth and, therefore, to achieving the desired advantageous layer qualities.

Furthermore, the inventive concept may be realized advantageously, in addition, in that the energy of the particles of the chemical compound to be deposited epitaxially is moderated in the carrier gas stream, i.e., for example, reduced and/or brought to a comparable level. In this respect, it is particularly advantageous when the particles of the chemical compound to be deposited epitaxially are brought in the carrier gas stream to a particle velocity which corresponds approximately to the particle velocity of the particles of the carrier gas stream. The advantage of this measure is to be seen in the fact that it is then possible to define the velocity of the particles of the chemical compound during the epitaxial deposition independently of the original velocity of the particles in the particle stream and so it is also possible to bring the velocity of the particles of the compound to be deposited epitaxially into an optimum range for an epitaxial layer growth via the velocity of the particles of the carrier gas stream.

For example, such a determination of the particle velocity of the carrier gas stream by determination of a pressure gradient in the carrier gas stream and of the absolute pressure level on the surface of the substrate is possible.

A carrier gas stream with the desired flow ratios on the surface of the substrate can be achieved in a particularly advantageous manner when the carrier gas stream is determined by the carrier gas flowing through a nozzle prior to formation thereof, the carrier gas stream thereby being determinable by means of the nozzle in an advantageous manner with respect to space and with respect to time fluctuations.

In order to obtain the desired flow ratios on the entire surface, in particular, of a substrate having a large surface area, it is preferable for the carrier gas to flow through not only a nozzle but a nozzle plate having a plurality of nozzles.

It has proven to be particularly expedient when the nozzles are designed as capillary tubes, a capillary tube being defined in accordance with the invention such that its length is more than 50 times its diameter and, preferably, the carrier gas flows through the capillary tube at the speed of sound.

No details have been given in conjunction with the preceding explanation of the individual embodiments of the inventive process concerning the type of punctual supply of energy for generating the particle stream.

It is, for example, possible to realize the punctual supply of energy by means of a gas discharge or by means of an electron beam.

It is, however, particularly advantageous when the punctual supply of energy to the target takes place by means of a laser beam, the laser beam thereby being preferably focused in order to remove the target material by way of ablation.

No details have been given in conjunction with the preceding explanation of the individual embodiments concerning the formation of the chemical compound to be deposited epitaxially, in particular the compound semiconductor material. For example, a simplest variation of the inventive process provides for the target material to comprise the chemical compound to be deposited epitaxially.

An alternative thereto provides for the target material to comprise one component of the chemical compound to be deposited epitaxially and for this to be caused to react with the other component contained in the gas surrounding the target during its removal due to the local, in particular punctual supply of energy.

Preferably, the reaction of the component of the compound to be deposited epitaxially comprised by the target material takes place near to the target surface and, therefore, in the energized state of this component necessary for its removal.

The advantage of this solution is to be seen in the fact that, with it, the energy necessary for the reaction with one another of the components of the chemical compound to be deposited epitaxially can be applied by way of the punctual supply of energy and this energy does not have any connection to the energy of the particles of the chemical compound during its epitaxial deposition on the substrate. This allows, in particular, the optimum conditions required for the reaction to be created and, at the same time, however, these optimum conditions to be attained with optimum conditions for the epitaxial deposition of the chemical compound.

In this respect, it is particularly advantageous when the reaction of the component contained in the gas surrounding the target with the component comprised by the target material takes place at a first gas pressure level advantageous for this reaction and this gas pressure level is likewise independent of the gas pressure level during the epitaxial deposition of the chemical compound from the carrier gas stream. For example, considerably higher gas pressures, which are advantageous for the chemical reaction, can thereby be realized whereas, during the subsequent epitaxial deposition, considerably lower gas pressures are favorable for an optimum epitaxial layer growth.

No details have so far been given concerning the supply of the component of the chemical compound to be epitaxially deposited via the gas surrounding the target. For example, it would be conceivable to introduce a separate gas in the region of the punctual supply of energy to the target likewise, for example, by a selective supply of gas.

It is, however, particularly advantageous when the carrier gas comprises the component required for the formation of the chemical compound to be deposited epitaxially.

In the simplest case, the carrier gas is selected such that this consists exclusively of the component of the chemical compound, with which the reaction with the component comprised by the target material can take place.

This embodiment has the great advantage that the carrier gas can be used, on the one hand, to supply the component necessary for the formation of the chemical compound and, on the other hand, to stabilize at the same time the formed chemical compound in the carrier gas and to attain optimized conditions for an epitaxial layer growth via the determination of the flow ratios of the carrier gas stream.

Particularly in those cases, in which as great a separation as possible between the formation of the chemical compound and the epitaxial deposition of the chemical compound is favorable, it has proven to be advantageous when the chemical compound to be deposited epitaxially, which is comprised by the particle stream, is introduced from a first carrier gas into a second carrier gas and the second carrier gas forms the carrier gas stream provided for defining the flow ratios during the epitaxial deposition of the chemical compound.

The inventive object is, in addition, accomplished by a device for the production of layers of a chemical compound on a substrate by means of epitaxy, with which, according to the invention, a chamber for vapor formation is provided, in which at least one component of the chemical compound to be deposited epitaxially is removed from a target by a local, in particular punctual supply of energy and a particle stream emanating from the target and comprising particles of the chemical compound to be deposited epitaxially is formed, with which a substrate chamber surrounding the substrate is provided and with which a carrier gas entering the chamber for vapor formation conveys the chemical compound to be deposited epitaxially from the chamber for vapor formation into the substrate chamber and forms in the substrate chamber a carrier gas stream which conveys the chemical compound to be deposited epitaxially to the surface of the substrate.

Furthermore, it has proven to be advantageous, in particular in order to be able to determine the pressure conditions in the chamber for vapor formation and the substrate chamber as far as possible independently of one another, when the carrier gas passes through a nozzle defining the carrier gas stream when passing from the chamber for vapor formation into the substrate chamber.

Preferably, it is not only one individual nozzle which is provided but a nozzle plate, particularly in the case of a substrate having a large surface.

Particularly favorable and defined flow ratios in the carrier gas stream may be attained when the nozzle is designed as a capillary tube.

In a different embodiment, particularly when an extensive separation between the chamber for vapor formation and the substrate chamber is expedient, it is advantageous when a first carrier gas introduces the chemical compound to be deposited epitaxially from the chamber for vapor formation into a nozzle having a second carrier gas flowing through it and the second carrier gas enters the substrate chamber while forming the carrier gas stream and conveys the chemical compound to be deposited epitaxially to the surface of the substrate by means of this carrier gas stream.

Additional features of the inventive device result from the individual embodiments of the inventive solution described in conjunction with the inventive process.

Additional features and advantages of the invention are the subject matter of the following description as well as of the drawings illustrating several embodiments.

DETAILED DESCRIPTION OF THE INVENTION

Figure 1:
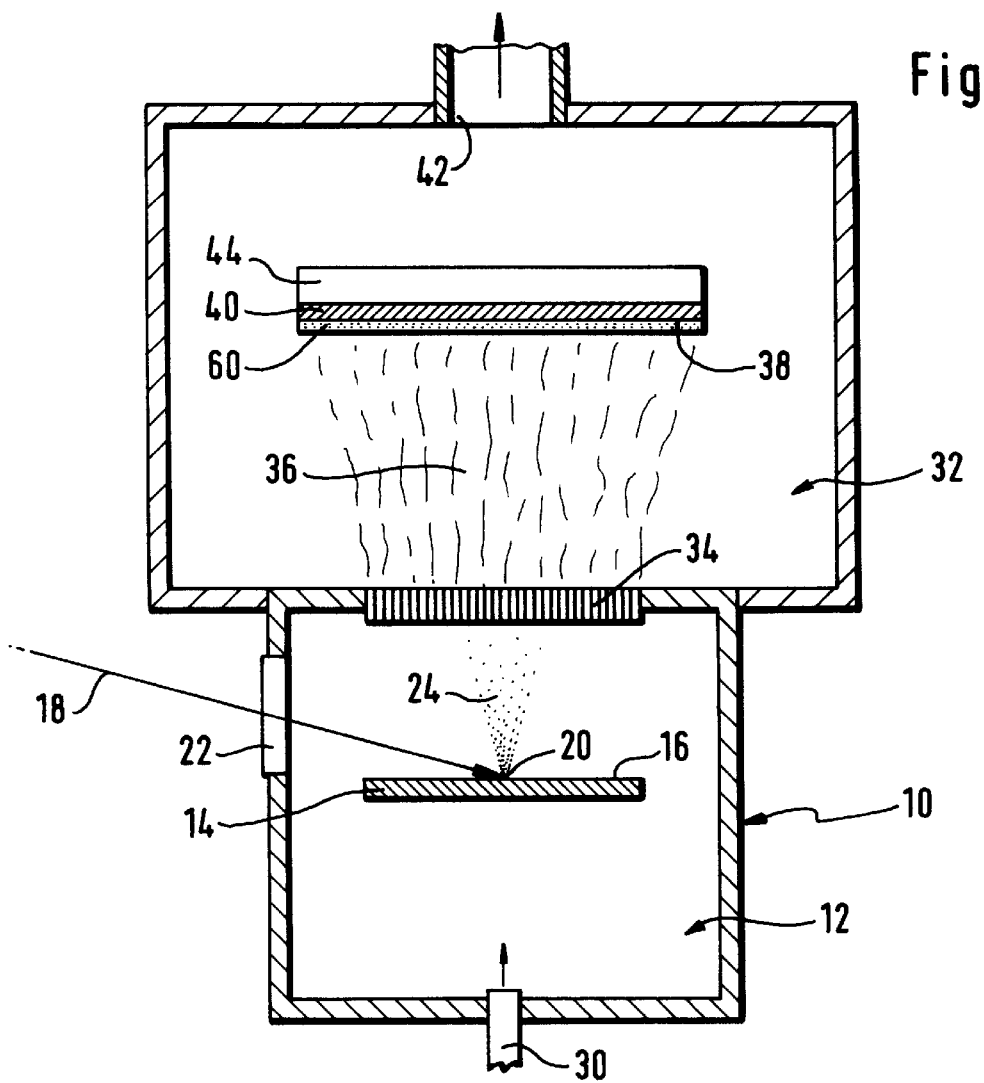
FIG. 1 is a schematic illustration of a first embodiment of an inventive device operating according to an inventive process.

One embodiment of an inventive device, illustrated in FIG. 1, comprises a housing which is designated as a whole as 10 and has a chamber for vapor formation 12, in which a target designated as a whole as 14 is arranged. The target is acted upon on an upper side 16 with a laser beam 18 in a region of focus 20, the laser beam 18 thereby entering the chamber for vapor formation 12 through a window 22 in the housing 10.

In the region of focus 20, a supply of energy to the material of the target 14 takes place and so a stream of vapor 24 emanates from this region of focus 20 and propagates in the chamber for vapor formation 12.

The stream of vapor 24 thereby comprises vaporous compound semiconductor material and therefore represents a particle stream which comprises molecules of the compound semiconductor material; the molecules can be present individually and/or as clusters.

The chamber for vapor formation 12 is provided, in addition, with a gas inlet 30, through which a carrier gas enters which flows through the chamber for vapor formation 12 and passes into a substrate chamber 32 via a capillary plate 34 separating the chamber for vapor formation 12 and the substrate chamber from one another.

In this embodiment, the target 14 faces the capillary plate 34 with its upper side 16 so that the stream of vapor 24 propagates towards the capillary plate 34.

Proceeding from the capillary plate 34, a carrier gas stream 36 is formed in the substrate chamber 32 and this carrier gas stream impinges on a surface 38 of a substrate designated as a whole as 40, and thereby has essentially constant flow parameters with respect to time at every point on the surface.

In this respect, the velocity of the carrier gas stream 36 is preferably approximately equal at every point on the surface 38. The same also applies by approximation for a density of the carrier gas stream 36 at every point on the surface 38.

Figure 2:
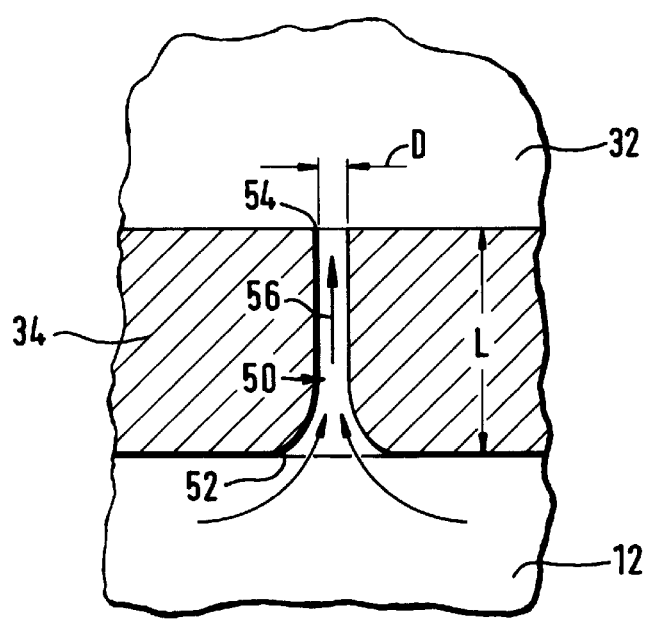
FIG. 2 is an enlarged illustration of the conditions in a capillary tube.

Such a formation of the carrier gas stream 36 is possible when, as illustrated in FIG. 2, the capillary plate 34 has at least one capillary tube designated as a whole as 50, the length L of which is greater than approximately 50 times its diameter D. Between an inlet opening 52 and an outlet opening 54 of the capillary tube 50, a pressure gradient prevails which leads in the capillary tube 50 to a flow velocity of the carrier gas in the longitudinal direction 56 of the capillary tube which corresponds approximately to the speed of sound.

The inlet opening 52 of the capillary tube 50 is preferably widened in the shape of a funnel towards the chamber for vapor formation 12 in order to allow the carrier gas to flow into the capillary tube 50 as free of turbulences as possible.

In a variation of the inventive process, it is provided for the target 14 to have the metallic component of a compound semiconductor, i.e., for example, Al or Ga or In, so that an ablation of this metallic component takes place by way of the laser beam 18 in the region of focus 20 due to the punctual supply of energy by means of the laser beam 18.

Furthermore, molecular nitrogen $N_2$ is supplied to the chamber for vapor formation 12 through the gas inlet 30 so that during the ablation of the metallic component in the region of focus 20 a reaction of the metallic component with the nitrogen takes place, forming AlN, GaN or InN. The pressure of the molecular nitrogen in the chamber for vapor formation 12 is thereby preferably greater than $10^{-2}$ or, even better, greater than $10^{-1}$ mbar. For example, the pressure of the nitrogen in the chamber for vapor formation 12 can be approximately 10 mbar.

The nitrogen supplied via the gas inlet 30 serves, however, not only as reaction gas for the formation of the compound semiconductor AlN or GaN or InN, which propagates as a stream of vapor 24 in the chamber for vapor formation 12, but at the same time as carrier gas which moderates the particle velocity in the stream of vapor 24, i.e. reduces it to the velocity of the carrier gas stream, and, moreover, the number of ions in the stream of vapor 24 is reduced.

The nitrogen flowing into the chamber for vapor formation 12 through the gas inlet 30 flows through the capillary plate 24 into the substrate chamber 32, taking with it the vaporous compound semiconductor propagating in the stream of vapor 24 in the chamber for vapor formation 12. The carrier gas stream 36 forming therein sees to it that the vaporous compound semiconductor impinges on the surface 38 of the substrate 40 with as low a velocity as possible, namely that of the carrier gas stream 36, and is deposited on this surface epitaxially.

For this purpose, carrier gas is drawn out of the substrate chamber on a side of the substrate chamber 32 located opposite the capillary plate via a suction opening 42 and so a pressure gradient advantageous for the epitaxy is thereby set between the chamber for vapor formation and the substrate chamber. The pressure is, for example, less in the substrate chamber than in the chamber for vapor formation by at least a factor of 10.

Advantageous velocity ratios of the carrier gas stream 36 which are constant with respect to time and space on the surface 38 of the substrate 40 are obtained when the substrate 40 is arranged between the capillary plate 34 and the suction opening 42 and faces the capillary plate 34 with the surface 38.

Furthermore, it is possible with the inventive process, via an attemperating device 44, to bring the substrate 40 to a temperature advantageous for an epitaxial deposition of the vaporous compound semiconductor on the surface 38 of the substrate 40 so that an epitaxial layer 60 having optimum layer qualities is in the end formed on the surface 38.

Alternatively thereto, a second variation of the first embodiment of the inventive device provides for silicon carbide SiC to be used as material for the target 14 and for this to be evaporated with the laser beam 18 in the region of focus 20 by ablation so that the stream of vapor 24 contains vaporous silicon carbide. This vaporous silicon carbide is then conveyed through the capillary plate 34 into the substrate chamber 32 by the carrier gas which enters the gas inlet 30 and, in this case, can be any type of inert gas, for example also a noble gas. In this respect, the carrier gas stream 36 is likewise formed in the advantageous manner described in the above and so a layer 60 of the compound semiconductor SiC can likewise be deposited epitaxially on the substrate 40.

For each case of use, the velocity of the carrier gas stream 36 as well as the density on the surface 38 of the substrate 40 and, in addition, the temperature of the substrate 40 can be adjusted exactly in accordance with an optimum epitaxial layer growth by adjusting the pressure gradient between the chamber for vapor formation 12 and the substrate chamber 32.

Figure 3:
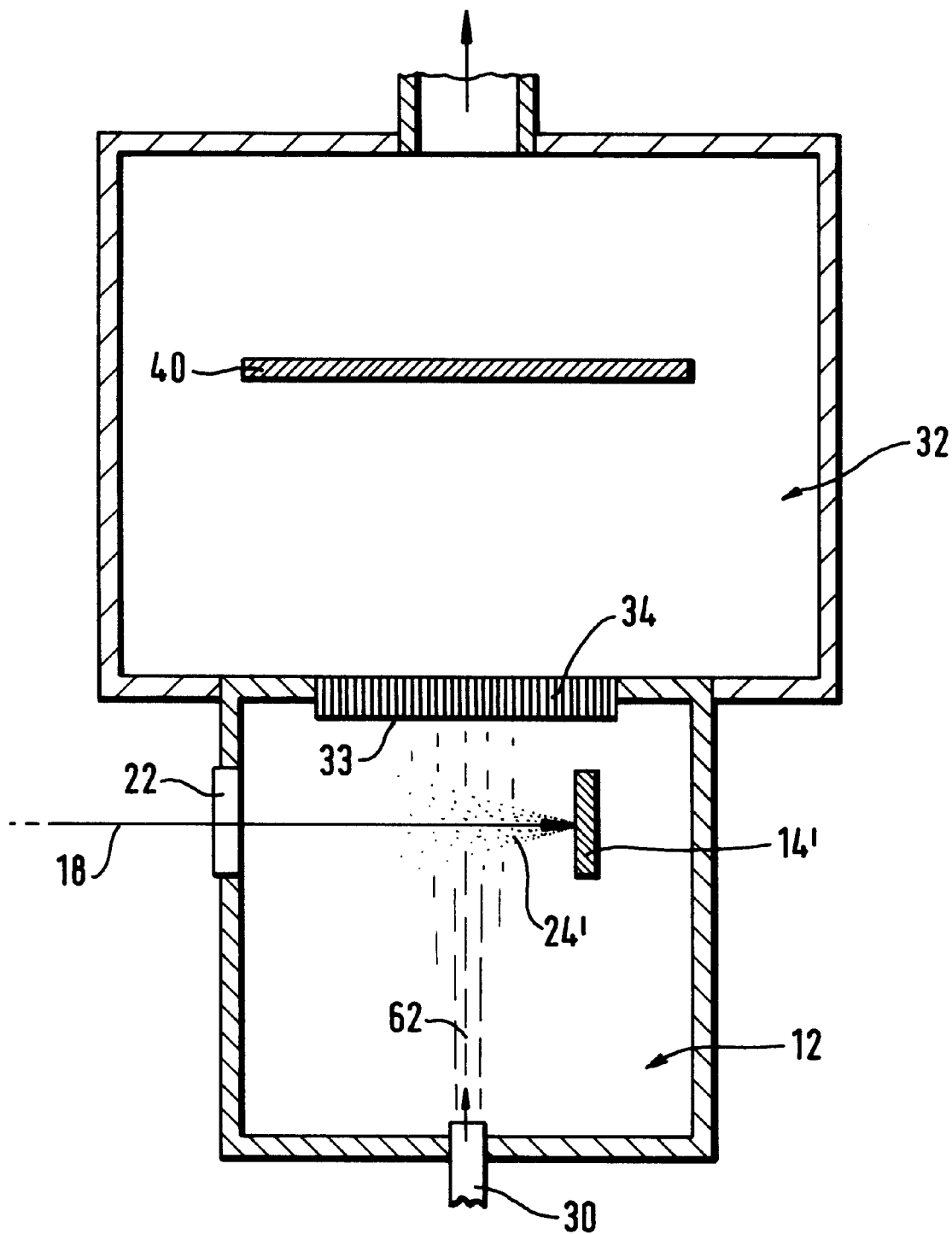
FIG. 3 is a schematic representation of a second embodiment of an inventive device.

A second embodiment of an inventive device, illustrated in FIG. 3, differs from the embodiment illustrated in FIG. 1 in that the stream of vapor 24' does not propagate in the direction of the capillary plate 34, like the stream of vapor 24 in the embodiment according to FIG. 1, but in a direction which extends approximately parallel to a surface 33 of the capillary plate 34 facing the chamber for vapor formation 12.

Furthermore, this embodiment provides for a direct carrier gas stream 62 which extends unhindered to the capillary plate 34 to be formed starting from the gas inlet; in this case the target 14' is arranged to the side of the carrier gas stream 62 so that the stream of vapor 24' propagates through the carrier gas stream 62, proceeding from one side of the carrier gas stream and, namely, transversely thereto so that an essentially uniform distribution of the vapor of the compound semiconductor in the carrier gas stream 62 can be achieved prior to the carrier gas entering the capillary plate 34.

As for the rest, the second embodiment according to FIG. 3 is designed in the same manner as the first and operates likewise in the same manner so that, in this respect, reference can be made in full to the comments on the first embodiment according to FIGS. 1 and 2.

Figure 4:
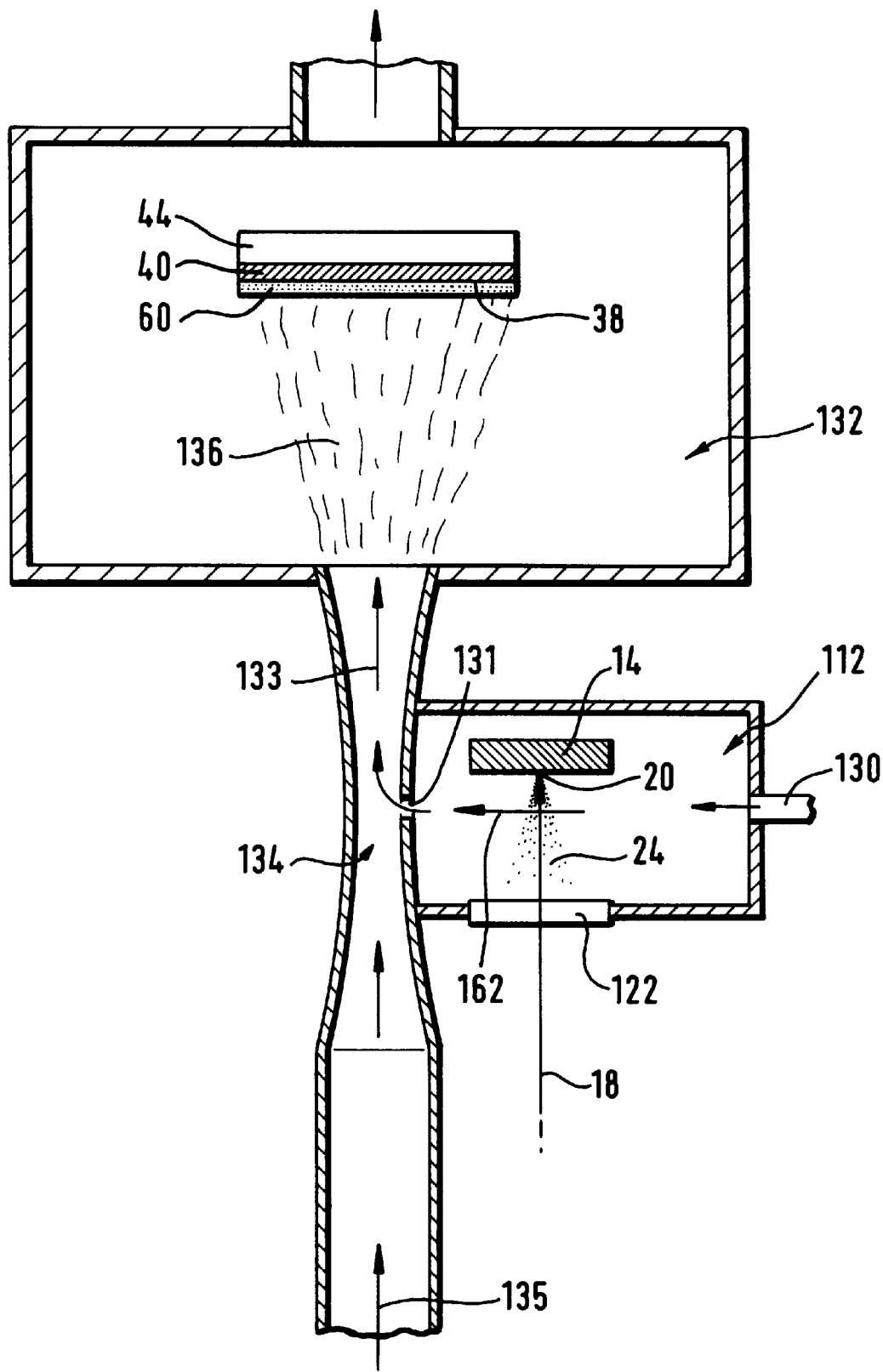
FIG. 4 is a schematic illustration of a third embodiment of an inventive device and FIG. 5 is a schematic illustration of a fourth embodiment of an inventive device.

In a third embodiment, illustrated in FIG. 4, a chamber for vapor formation 112 is provided, in which the target 14 is arranged. In addition, the chamber for vapor formation 112 likewise comprises a window 122, through which the laser beam 18 passes in order to supply essentially punctual energy to the target material in a region of focus 20 and to generate the stream of vapor 24 which comprises molecules of the desired compound semiconductor.

The chamber for vapor formation 112 has, in addition, a gas inlet 130, through which a first carrier gas enters the chamber for vapor formation 112, and an outlet 131, through which carrier gas taking along the vapor of the compound semiconductor enters a nozzle 134 to the side of a main direction of flow 133 and is swept along by a second carrier gas jet 135 passing through the nozzle 134 in the main direction of flow 133. After leaving the nozzle 134, the second carrier gas jet 135 enters the substrate chamber 132 and forms therein a carrier gas stream 136 which, in the same way as the carrier gas stream 36 in the first and second embodiments, is constant with respect to time and space over the surface 38 of the substrate 40 in order to ensure an optimum epitaxial layer growth on the substrate 40 during build-up of the epitaxial layer 60.

In the third embodiment according to FIG. 4, the first carrier gas which passes through the chamber for vapor formation 112 is, for example, nitrogen and the target 14 consists of the metallic component, for example Al or Ga or In, so that, at the same time, the first carrier gas also represents the nitrogen as second component of the compound semiconductor which is formed during ablation of the metallic component from the target 14 by means of the laser beam 18 and propagates in the stream of vapor 24. At the same time, the first carrier gas serves to convey the compound semiconductor propagating in the stream of vapor 24 to the outlet 131 and, therefore, into the nozzle 134, proceeding from which the vapor of the compound semiconductor is then conveyed by means of the second carrier gas, together with the parts of the first carrier gas, in the direction of the substrate 40, thereby forming the carrier gas stream 136 which is constant with respect to time and locality, in order to ensure an optimum epitaxial growth of the layer 60 on the substrate 40.

The second carrier gas can, in the simplest case, be identical to the first carrier gas. It is, however, likewise possible to select the second gas as a gas inert with respect to the vapor of the compound semiconductor, whereby the selection of the second carrier gas can be adapted with a view to it forming an optimum carrier gas stream 136 and likewise promotes the epitaxial growth of the layer 60.

The target 14 of the third embodiment according to FIG. 4 is preferably arranged in the chamber for vapor formation 112 in the same way as in the second embodiment, i.e. to the side of a carrier gas stream 162 of the first carrier gas.

As for the rest, the third embodiment according to FIG. 4 functions in the same way as that described in conjunction with the first or second embodiment and so, in this respect, reference is made in full to the comments on these embodiments.

Figure 5:
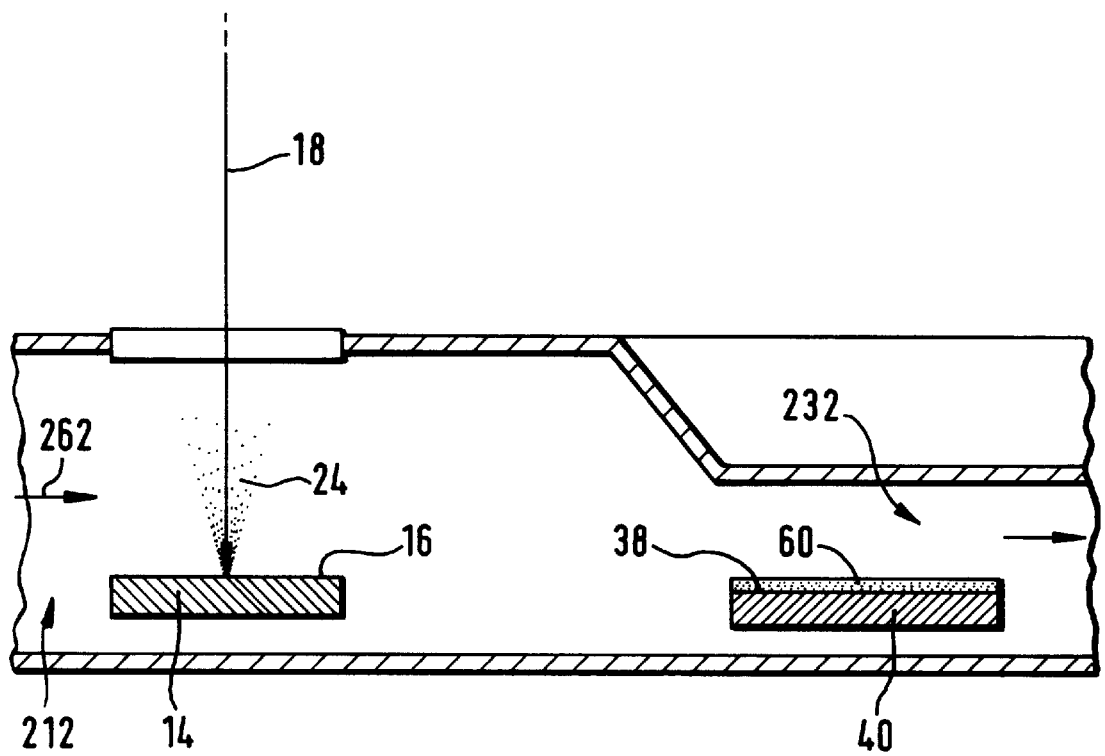

In a fourth embodiment, illustrated in FIG. 5, the target 14 and the substrate 40 are arranged parallel to a carrier gas stream 262, the chamber for vapor formation 212, in which the target 14 is arranged, and the substrate chamber 232 merging into one another and the substrate chamber 232 having a narrower flow cross section than the chamber for vapor formation 212, through which the carrier gas stream 262 flows.

The target 14 is likewise arranged to the side of the carrier gas stream 262 so that the stream of vapor 24 propagating from the upper side 16 of the target propagates transversely to the carrier gas stream 262 and passes therethrough and in the same way as in the embodiments described in the above a moderation of the stream of vapor 24 and an entrainment of the vapor of the compound semiconductor in the carrier gas stream 262 take place. Due to the constriction of the flow cross section and due to the arrangement of the substrate 40 in the constricted flow cross section of the substrate chamber 232 uniform flow ratios with respect to space and time are created on the surface 38 of the substrate 40 in order to ensure an optimum growth of the epitaxial layer 60 on the surface 38 of the substrate 40.

In contrast to the preceding embodiments, the pressure in the substrate chamber in this embodiment is approximately equal to the pressure in the chamber for vapor formation.

As for the rest, the fourth embodiment according to FIG. 5 functions in the same way as that explained in conjunction with the embodiments described in the above and so, in this respect, reference is made in full to the comments on the embodiments described in the above.

The present disclosure relates to the subject matter disclosed in German application No. P 19 510 318.1 of Mar. 22, 1995.

What is claimed is:

1. A process for producing layers of compound semiconductors on a substrate by means of epitaxy, comprising the steps of:

providing a target material comprising a first component of a compound semiconductor material to be deposited epitaxially, providing a gas surrounding the target material, said gas comprising a second component of the compound semiconductor material to be deposited epitaxially, providing a supply of energy to the target material to remove said first component from the target by ablation, using said supply of energy as a sole supply of energy for causing a reaction of said first component removed from the target with said second component in said gas to form said compound semiconductor material, wherein a particle stream emanating from the target and comprising said components of said compound semiconductor material is formed, and providing a carrier gas stream to convey said components of said compound semiconductor material in said particle stream in a direction of the substrate to enable said compound semiconductor material to grow as an epitaxial layer on the substrate.

2. A process as defined in claim 1, wherein:

at least one of a velocity and a density of the carrier gas stream is constant with respect to time at a surface of the substrate.

3. A process as defined in claim 1, wherein:
a velocity of the carrier gas stream has comparable values over an entire surface of the substrate.

4. A process as defined in claim 1, wherein:
a density of the carrier gas stream has comparable values over an entire surface of the substrate.

5. A process as defined in claim 1, wherein:
the energy of the particles of the compound semiconductor material to be deposited epitaxially is moderated in the carrier gas stream.

6. A process as defined in claim 5, wherein:
the particles of the compound semiconductor material to be deposited epitaxially are brought in the carrier gas stream to a particle velocity corresponding approximately to a particle velocity of the carrier gas stream.

7. A process as defined in claim 1, wherein:
flow ratios of the carrier gas stream at a surface of the substrate are defined by the carrier gas being conveyed through a nozzle prior to formation of the carrier gas stream.

8. A process as defined in claim 7, wherein:
the carrier gas is conveyed through a plate of the nozzle for the formation of the carrier gas stream.

9. A process as defined in claim 1, wherein:
the energy is supplied to the target by means of a laser beam.

10. A process as defined in claim 1, wherein:
the reaction of the first component with the second component takes place essentially near a surface of the target.

11. A process as defined in claim 1, wherein:
the carrier gas comprises the second component, which is necessary for the formation of the compound semiconductor material to be deposited.

12. A process as defined in claim 11, wherein:
the carrier gas consists exclusively of the second component.

13. A process for producing layers of compound semiconductors on a substrate by means of epitaxy, comprising the steps of:
providing a target material comprising a first component of a compound semiconductor material to be deposited epitaxially,
providing a gas surrounding the target material, said gas comprising a second component of the compound semiconductor material to be deposited epitaxially,
providing a laser beam as a supply of energy to remove the first component from the target by ablation, and
using said laser beam as a sole supply of energy for causing a reaction of the first component removed from the target with the second component contained in said gas to form the compound semiconductor material,
wherein said components propagate in the form of a particle stream in the direction of the substrate to enable said compound semiconductor material to grow as an epitaxial layer on the substrate.

14. A process as defined in claim 13, wherein the particle stream is in the form of a stream of vapor.

15. A process as defined in claim 13, wherein said gas consists exclusively of the second component of the compound semiconductor material.

16. A process as defined in claim 13, wherein the kinetic energy of the particles of the compound semiconductor material to be deposited epitaxially is moderated in a carrier gas stream.

17. A process as defined in claim 16, wherein particles of the compound to be deposited epitaxially are brought to a particle velocity in said carrier gas stream corresponding approximately to the particle velocity of the carrier gas stream.

18. A process as defined in claim 13, wherein at least one of a velocity and a density of the carrier gas stream is constant with respect to time at a surface of the substrate.

19. A process as defined in claim 18, wherein a velocity of the carrier gas stream has comparable values over an entire surface of the substrate.

20. A process as defined in claim 18, wherein a density of the carrier gas stream has comparable values over an entire surface of the substrate.

21. A process for producing layers of compound semiconductors on a substrate by means of epitaxy, comprising the steps of:
providing a target material comprising a first component of a compound semiconductor material to be deposited epitaxially;
providing a gas surrounding the target material, said gas comprising a second component of the compound semiconductor material to be deposited epitaxially;
providing a supply of energy to the target material to remove said first component from the target by ablation;
using said supply of energy as a sole supply of energy for causing a reaction of said first component removed from the target with said second component in said gas to form said compound semiconductor material;
wherein a particle stream emanating from the target and comprising said components of said compound semiconductor material is formed; and
providing a carrier gas stream to convey said components of said compound semiconductor material in said particle stream in a direction of the substrate to enable said compound semiconductor material to grow as an epitaxial layer on the substrate; wherein:
flow ratios of the carrier gas stream at a surface of the substrate are defined by the carrier gas being conveyed through a nozzle prior to formation of the carrier gas stream; and
the nozzle comprises a capillary tube for conveying the carrier gas prior to formation of the carrier gas stream.

22. A process for producing layers of compound semiconductors on a substrate by means of epitaxy, comprising the steps of:
providing a target material comprising a first component of a compound semiconductor material to be deposited epitaxially;
providing a gas surrounding the target material, said gas comprising a second component of the compound semiconductor material to be deposited epitaxially;
providing a supply of energy to the target material to remove said first component from the target by ablation;
using said supply of energy as a sole supply of energy for causing a reaction of said first component removed from the target with said second component in said gas to form said compound semiconductor material;
wherein a particle stream emanating from the target and comprising said components of said compound semiconductor material is formed; and
providing a carrier gas stream to convey said components of said compound semiconductor material in said particle stream in a direction of the substrate to enable said compound semiconductor material to grow as an epitaxial layer on the substrate;

wherein the reaction of the first and second components with one another takes place at a first gas pressure level differing from a second gas pressure level at which the compound semiconductor material is deposited epitaxially.

23. A process for producing layers of compound semiconductors on a substrate by means of epitaxy, comprising the steps of:

providing a target material comprising a first component of a compound semiconductor material to be deposited epitaxially, providing a gas surrounding the target material, said gas comprising a second component of the compound semiconductor material to be deposited epitaxially, providing a supply of energy to the target material to remove said first component from the target by ablation, using said supply of energy as a sole supply of energy for causing a reaction of said first component removed from the target with said second component in said gas to form said compound semiconductor material, wherein a particle stream emanating from the target and comprising said components of said compound semiconductor material is formed, and providing a carrier gas stream to convey said components of said compound semiconductor material in said particle stream in a direction of the substrate to enable said compound semiconductor material to grow as an epitaxial layer on the substrate;

wherein the compound semiconductor material to be deposited epitaxially comprised by the particle stream is introduced from a first carrier gas into a second carrier gas, and the second carrier gas forms the carrier gas stream defining flow ratios during the epitaxial deposition of the compound semiconductor material.

* * * * *